United States Patent [19]

Michii

[11] Patent Number: 5,252,853
[45] Date of Patent: Oct. 12, 1993

[54] PACKAGED SEMICONDUCTOR DEVICE HAVING TAB TAPE AND PARTICULAR POWER DISTRIBUTION LEAD STRUCTURE

[75] Inventor: Kazunari Michii, Itami, Japan

[73] Assignee: Mitsubishi Denki Kabushiki Kaisha, Tokyo, Japan

[21] Appl. No.: 944,242

[22] Filed: Sep. 14, 1992

[30] Foreign Application Priority Data

Sep. 19, 1991 [JP] Japan .................. 3-239516

[51] Int. Cl.⁵ .......................................... H01L 23/48
[52] U.S. Cl. ................................ 257/666; 257/691; 257/668
[58] Field of Search ............... 257/666, 667, 668, 669, 257/670, 671, 672, 673, 674, 675, 676, 691, 787; 437/217, 220, 206; 361/421

[56] References Cited

U.S. PATENT DOCUMENTS

| | | | |
|---|---|---|---|
| 4,916,519 | 4/1990 | Ward | 357/70 |
| 5,068,712 | 11/1991 | Murakami et al. | 257/687 |
| 5,115,298 | 5/1992 | Loh | 257/787 |
| 5,146,312 | 9/1992 | Lim | 257/676 |
| 5,164,815 | 11/1992 | Lim | 257/666 |

FOREIGN PATENT DOCUMENTS 61-218139 9/1986 Japan .
61-241959 10/1986 Japan .
2-246125 10/1990 Japan .

Primary Examiner—Rolf Hille
Assistant Examiner—S. V. Clark
Attorney, Agent, or Firm—Leydig, Voit & Mayer

[57] ABSTRACT

A packaged semiconductor device having an LOC structure, a thin body, and good electrical characteristics employs a TAB tape. A semiconductor chip carries ground pads arranged in a row, power pads arranged in another row, and signal pads arranged in two rows on both sides of the rows of ground and power pads. A shared ground lead and a shared power lead extend along and are connected to ground pads and power pads, respectively.

5 Claims, 5 Drawing Sheets

PACKAGED SEMICONDUCTOR DEVICE HAVING TAB TAPE AND PARTICULAR POWER DISTRIBUTION LEAD STRUCTURE

BACKGROUND OF THE INVENTION

1. Field of the Invention

The present invention relates to a packaged semiconductor device having an LOC (lead on chip) structure in which inner leads are arranged on a semiconductor chip.

2. Description of the Related Art

A packaged semiconductor device which has an LOC structure is disclosed in, for example, Japanese Patent Publications 61-241959 and 2-246125. The internal structure of such a semiconductor apparatus is shown in FIG. 5. The LOC structure is advantageous for packaging a large chip having a large capacity or many functions in a package and for achieving good electric characteristics. Referring to FIG. 5, a large chip 101 sealed by sealing resin 110 carries in a central portion of the top surface thereof a row of bonding pads 102 arranged along the length of the semiconductor chip 101. The bonding pads 102 include signal pads, power pads, and ground pads. The power pads and the ground pads are provided to mitigate electric noise. The top surface of the semiconductor 101 except a portion where the bonding pads 102 are provided is covered by an insulating α-barrier 103 which blocks α rays.

A plurality of leads 104 are arranged on top of the α-barrier 103. The inside terminal of each lead 104 is electrically connected to a corresponding bonding pad 102 by means of Au-wire 105. Four leads 106 are provided in lengthwise end portions of the semiconductor chip 101. The leads 106 at opposite ends are connected to each other by means of buses 107 provided on the α-barrier 103. These end-portion leads 106 and buses 107 connecting them are connected to the bonding pads 102 at different sites and used as a power lead, a ground lead, and a reference-voltage lead. The buses 107 longitudinally extend beside the row of bonding pads 102 through a central portion of the semiconductor chip 101. Such buses 107 make it possible to connect the buses 107 at different locations to the power pads and/or the ground pads 102. The buses 107 also cool the semiconductor chip 101. The leads 104 and 106 also serve as die pads.

A conventional semiconductor apparatus employs a wire bonding method in which Au-wires are used to connect the bonding pads and the inside terminals of the leads. Lately, there has been a growing demand for a thin packaged semiconductor device, for example, having a thickness of 0.5 mm or less for a memory card. To produce such a thin semiconductor device, a TAB (tape automated bonding) method in which leads are directly connected to bonding pads is more advantageous than the wire bonding method. However, if the TAB method is employed in the structure of a conventional semiconductor apparatus, a problem will be caused. Because a plurality of power pads, ground pads, and signal pads are arranged in a row in the conventional structure, the power pads or the ground pads for reducing electrical noise cannot be directly connected to a single lead. Therefore, an attempt to reduce electrical noise will fail if the TAB method is employed in the conventional structure.

SUMMARY OF THE INVENTION

The present invention is intended to solve the problems of conventional packaged semiconductor devices as stated above. Accordingly, an object of the present invention is to provide a packaged semiconductor device which has the LOC structure and employs the TAB method so as to achieve a thin body and good electric characteristics.

To achieve the above objects, according to the present invention, a packaged semiconductor device comprises: a semiconductor chip having at least one main surface; a first group of bonding pads including a plurality of power pads arranged in a row at a central portion of the main surface of the semiconductor chip and/or a plurality of ground pads arranged in another row at the central portion of the main surface of the semiconductor chip; a second group of bonding pads including a plurality of signal pads arranged in two rows along both sides of the first group of bonding pads; insulating thin films which cover portions of the main surface on both outer sides of the second group of bonding pads; a TAB tape including at least one shared lead which extends along the row of ground pads and/or the row of power pads and is directly and electrically connected to the pads in the associated row and has outside terminal portions at both of its end portions, a plurality of signal leads each of which has an outside terminal portion and an inside terminal portion that is directly and electrically connected to the corresponding signal pad of the second group of bonding pads, and an insulating tape portion fixing the shared lead and the signal leads at individually predetermined positions; and a sealing resin encapsulating all the above-mentioned components and portions, except the outside terminal portions of the shared lead and the signal leads, to form a thin packaged semiconductor device, the outside terminal portions being exposed outside the resin.

In a packaged semiconductor device according to the present invention, a plurality of power pads are arranged in a row at a central portion of the semiconductor chip, and a plurality of ground pads are arranged in another row at the central portion of the semiconductor chip. Therefore, the pads in each row can be connected to a single shared lead.

DESCRIPTION OF THE PREFERRED EMBODIMENTS

The preferred embodiments of the present invention will be described hereinafter with reference to the attached drawings.

Figure 1:
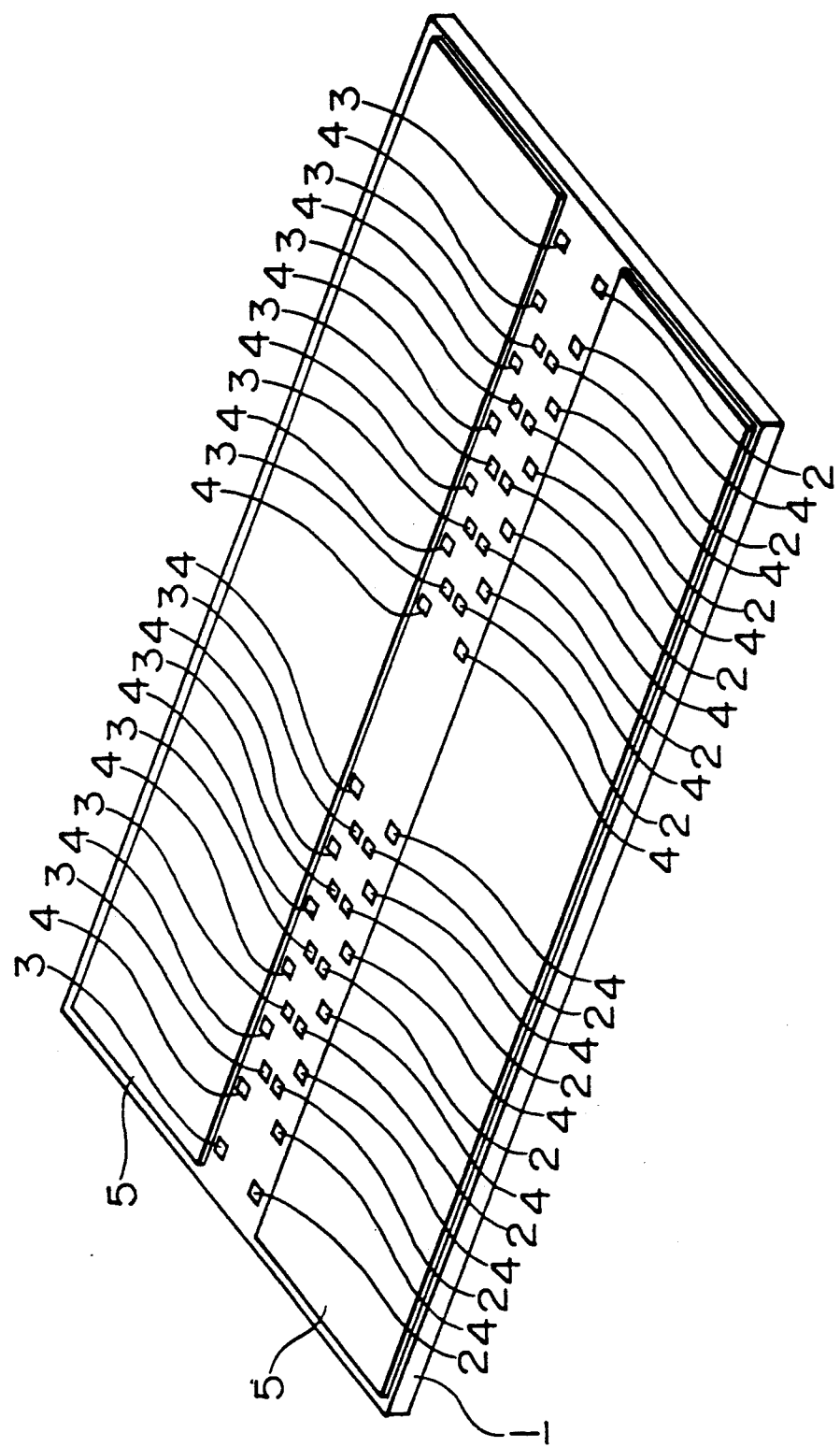
FIG. 1 is a perspective view of a semiconductor chip used in a semiconductor apparatus device according to an embodiment of the present invention.

Referring to FIG. 1, a main surface of a semiconductor chip 1 has a plurality of ground pads 2 which are arranged in a row longitudinally extending along a central portion of the main surface, and a plurality of power pads 3 which are arranged in a row longitudinally extending along the central portion. A plurality of signal pads 4 are arranged in two rows along the outer sides of the rows of ground and power pads 2 and 3. A ground pad 2 is provided at each end of one of the two rows of the signal pads 4, and a power pad 3 is provided at each end of the other row of the signals pads 4. These ground and power pads 2 and 3 constitute a first bonding pad group, and the signal pads 4 constitute a second bonding pad group. The main surface of the semiconductor chip 1 except the central portion where these pads are provided is covered with polyimide films 5, which do not conduct electricity and block α rays.

Figure 2:
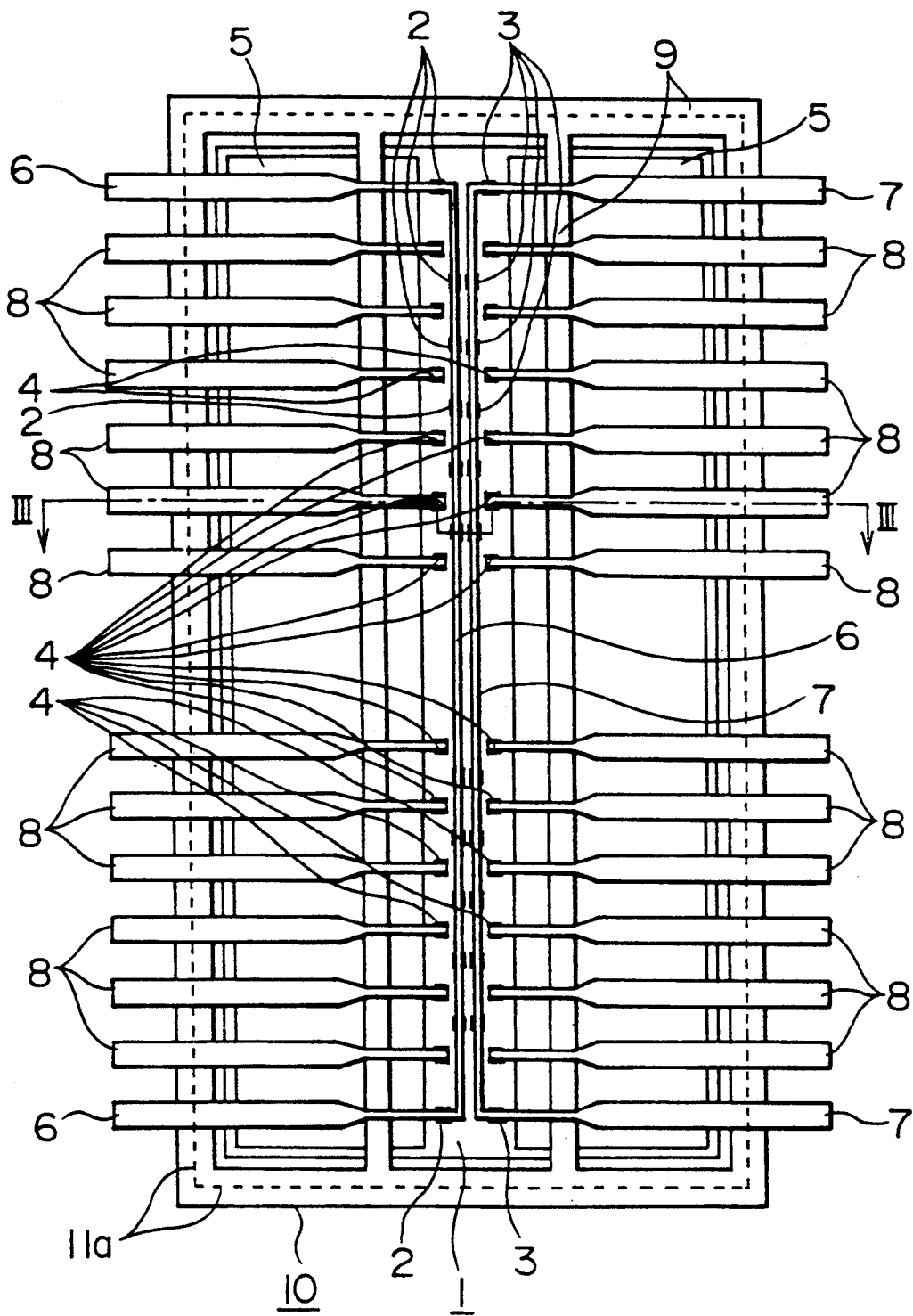
FIG. 2 is a plan view of the internal structure of a semiconductor device employing the semiconductor chip shown in FIG. 1, according to an embodiment of the present invention.
Figure 3:
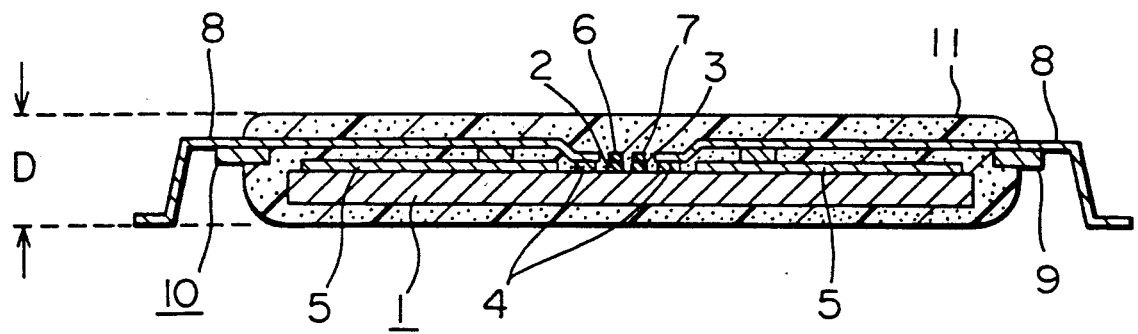
FIG. 3 is a sectional view taken along the line III—III of FIG. 2.

FIGS. 2 and 3 show the internal structure under the sealing resin of a packaged semiconductor device according to an embodiment of the invention. A TAB tape 10 is composed of a polyimide tape 9 and a shared ground lead 6, a shared power lead 7, and signal leads 8 which leads are positioned and fixed on the polyimide tape 9 so that the inside terminals of these leads can be directly connected to the associated pads. This TAB tape 10 is disposed on the semiconductor chip 1, with the leads directly connected to the associated pads.

The shared ground lead 6 has a bus portion which extends along the row of ground pads 2 and is directly connected to all the ground pads 2. Both end portions of the shared ground lead 6 are so bent as to be correspondingly connected to the two ground pads 2 which are provided at the ends of one row of the signal pads 4. Both of the end portions of the shared ground lead 6 extend out of sealing resin 11.

The shared power lead 7, formed in substantially the same shape as the shared ground lead 6, has a bus portion which extends along the row of power pads 3 and is directly connected to all the power pads 3. Two end portions of the shared power lead 7 are bent to be correspondingly connected to the two power pads 3 which are provided at the ends of the other row of the signal pads 4. The two end portions of the shared power lead 7 extend out of the sealing resin 11.

Each of the signal leads 8 is directly connected at one end to the corresponding signal pad 4. The other end portion of each signal lead 8 extends out of the sealing resin 11.

The polyimide films 5 and polyimide tape 9, which are insulating members, are placed between the semiconductor chip 1 and the leads, i.e., the shared ground lead 6, the shared power lead 7, and the signal leads 8. A portion of the semiconductor chip 1, enclosed by a broken line 11a in FIG. 2, is sealed by the sealing resin 11, as shown in FIG. 3. To facilitate forming a thin semiconductor apparatus according to the present invention having a small thickness D (see FIG. 3), e.g., 0.5 mm, the area of the polyimide tape 9 is made as small as possible, because a polyimide tape 9 having a large area will hinder the sealing resin from smoothly flowing when the sealing resin is injected into an accordingly thin mold cavity (not shown) to encapsulate the semiconductor apparatus. Further, because the leads 6, 7, and 8 are long and as thin as 35μ, the leads are bent toward the semiconductor chip 1 by the injection of the sealing resin. This would result in a short circuit therebetween if it were not for the polyimide films 5. Thus, the polyimide films 5 prevent a short circuit as well as shield α rays.

Because, in a conventional packaged semiconductor device, the power, ground, and signal pads are arranged in a row and the bus portions extend between the row of pads and inside terminals of the leads, the group of ground pads or the group of power pads cannot be directly connected to a single lead if the TAB method is employed. However, according to this embodiment, the ground pads 2 are arranged in one row and the power pads 3 in another row, and the signal pads 4 are arranged in two rows along the outer sides of the rows of ground pads 2 and power pads 3. Such arrangement of pads makes it possible to employ the shared ground lead 6 and the shared power lead 7 which extend along the rows of ground pads 2 and power pads 3, respectively. In such a structure, the ground pads 2 and the power pads 3 can be directly connected to the shared ground lead 6 and the shared power lead 7, respectively. Electrical noise can be thus reduced. Further, because Au-wires are not employed, the resistance of the circuitry is reduced and the operation of the semiconductor device is faster.

Figure 4:
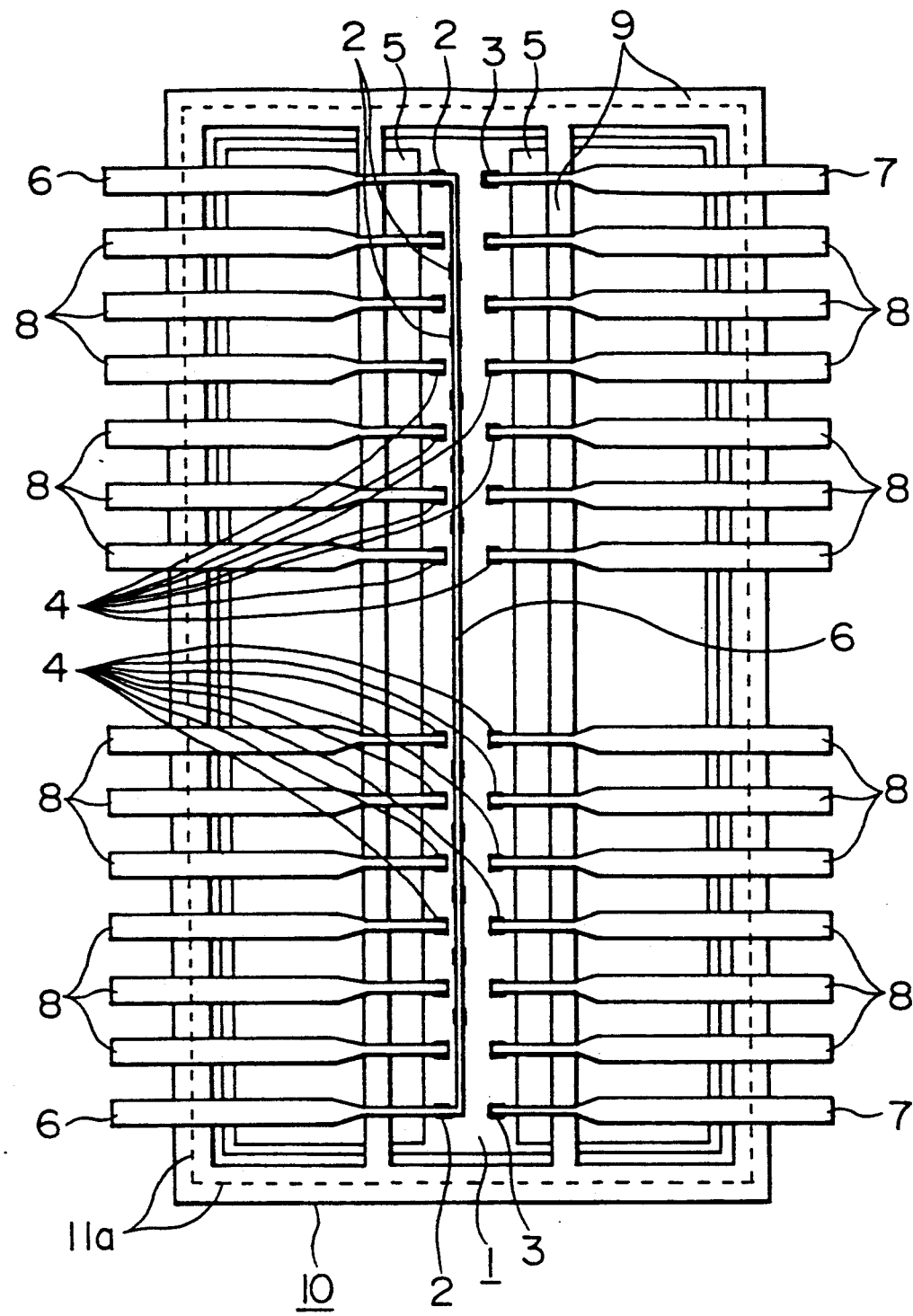
FIG. 4 is a plan view of the internal structure of a semiconductor device according to another embodiment of the present invention.
Figure 5:
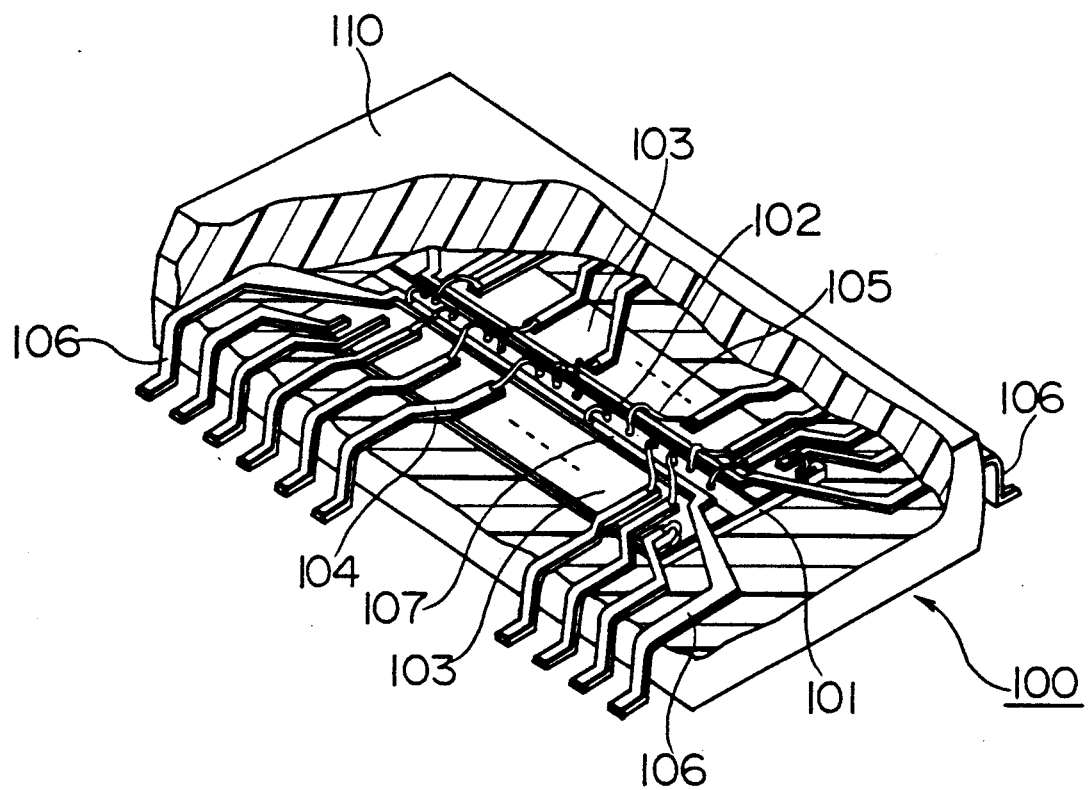
FIG. 5 is a perspective view of a conventional semiconductor device having an LOC structure, partially showing the internal construction thereof.

Although both the ground pads and the power pads are arranged in rows in the above embodiment, either the ground pads or the power pads may be arranged in a row. Such an arrangement still provides substantially the same effects. FIG. 4 shows a semiconductor apparatus in which ground pads 2 alone are arranged in a row and directly connected to a single shared ground lead 6.

According to the present invention, a packaged semiconductor device having an LOC structure, which can advantageously package a large chip of a large capacity or multiple functions in a small package (sealing resin), comprises a TAB tape and a plurality of ground pads and plurality of power pads which are arranged in respective rows and connected to a shared ground lead and to a shared power lead, respectively. Thus, the present invention achieves a packaged semiconductor device which has a large capacity and/or many functions, a thin body, and good electrical characteristics.

What is claimed is:

1. A packaged semiconductor device comprising:
   a semiconductor chip having at least one main surface;
   a first group of bonding pads including a plurality of bonding pads arranged in a row along a central portion of said main surface of said semiconductor chip;
   a second group of bonding pads disposed on the main surface and including a plurality of signal pads arranged in two rows on opposite sides of said first group of bonding pads;
   two spaced apart insulating thin films covering respective portions of the main surface with said second group of bonding pads therebetween;
   a TAB tape including at least one shared lead having two ends, extending along and directly electrically connected to the row of said first group of bonding pads and including outside terminal portions at both ends, a plurality of signal leads, each having an outside terminal portion and an inside terminal portion, said inside terminal portion being directly electrically connected to a corresponding signal pad of said second group of bonding pads, and an insulating tape on which said shared lead and said signal leads are mounted at predetermined positions; and a sealing resin encapsulating said semiconductor chip, said first and second groups of bonding pads, and said TAB tape except said outside terminal portions of said shared lead and said signal leads.

2. The packaged semiconductor device claimed in claim 1 wherein said first group of bonding pads includes a plurality of ground pads arranged in a row along the central portion of said main surface of said semiconductor chip and said TAB tape includes one shared lead directly electrically connected to said ground pads.

3. The packaged semiconductor device claimed in claim 1 wherein said first group of bonding pads includes a plurality of power pads arranged in a row along the central portion of said main surface of said semiconductor chip and said TAB tape includes one shared lead directly electrically connected to said power pads.

4. The packaged semiconductor device claimed in claim 1 wherein said first group of bonding pads includes a plurality of power pads arranged in a row along the central portion of said main surface of said semiconductor chip and a plurality of ground pads arranged in another row along the central portion of said main surface of said semiconductor chip and said TAB tape includes first and second shared leads, said first shared lead extending along and directly electrically connected to said ground pads and said second shared lead extending along and directly electrically connected to said power pads.

5. The packaged semiconductor device claimed in claim 1 wherein one of a power pad and a ground pad is provided at each end of at least one row of said signal pads and said outside terminal portions of said shared lead are bent to extend outward so that said outside terminal portions are directly electrically connected to said one of a power and ground pad provided at each end of said at least one row of said signal pads.

* * * * *